(12) United States Patent
Inaba et al.

(10) Patent No.: US 7,687,387 B2
(45) Date of Patent: Mar. 30, 2010

(54) SEMICONDUCTOR DEVICE AND METHOD OF MANUFACTURING THE SAME

(75) Inventors: Jungo Inaba, Yokkaichi (JP); Daina Inoue, Yokkaichi (JP); Mutsumi Okajima, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/193,349

(22) Filed: Aug. 18, 2008

(65) Prior Publication Data
US 2009/0050951 A1 Feb. 26, 2009

(30) Foreign Application Priority Data
Aug. 23, 2007 (JP) ............................. 2007-216748

(51) Int. Cl.
*H01L 21/3205* (2006.01)
(52) U.S. Cl. .................. 438/585; 438/241; 438/261; 438/589; 438/593; 257/E21.249
(58) Field of Classification Search .................. 438/252
See application file for complete search history.

(56) References Cited

U.S. PATENT DOCUMENTS

2006/0234165 A1* 10/2006 Kamigaki et al. ........... 430/313

2007/0003881 A1 1/2007 Ito et al.
2007/0238053 A1* 10/2007 Hashimoto .................. 430/313
2008/0017992 A1 1/2008 Kito et al.

FOREIGN PATENT DOCUMENTS

JP 2003-197779 7/2003

* cited by examiner

*Primary Examiner*—N Drew Richards
*Assistant Examiner*—Kyoung Lee
(74) *Attorney, Agent, or Firm*—Finnegan, Henderson, Farabow, Garrett & Dunner, L.L.P.

(57) ABSTRACT

A method of manufacturing a semiconductor device according to an embodiment of the present invention includes depositing first to third mask layers above a substrate, processing the third mask layer, processing the second mask layer, slimming the second mask layer in an L/S section and out of the L/S section, peeling the third mask layer in the L/S section and out of the L/S section, forming spacers on sidewalls of the second mask layer in the L/S section and out of the L/S section, etching the second mask layer in the L/S section, under a condition that the second mask layer out of the L/S section is covered with a resist, to remove the second mask layer in the L/S section while the second mask layer out of the L/S section remains, and processing the first mask layer by etching, using the spacers in the L/S section and out of the L/S section and the second mask layer out of the L/S section as a mask, the spacers in the L/S section and out of the L/S section and the second mask layer out of the L/S section being thinned by the etching.

15 Claims, 8 Drawing Sheets

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2007-216748, filed on Aug. 23, 2007, the entire contents of which are incorporated herein by reference.

BACKGROUND OF THE INVENTION

1. Field of the Invention

The present invention relates to a semiconductor device and a method of manufacturing the same.

2. Background Art

A Flash memory is one of nonvolatile semiconductor memories widely used at present. An example of the flash memory includes a NAND-type flash memory. A gate structure of the flash memory typically includes a first gate insulator called a tunnel insulator, a first gate electrode called a floating gate, a second gate insulator called an inter layer dielectric, and a second gate electrode called a control gate. An example of the flash memory having such gate structure is disclosed in JP-A2003-197779 (KOKAI).

A gate processing of the flash memory is often performed with a hard mask. In the case, an L/S (line and space) section, an SG (selection gate) section, and a peripheral Tr (transistor) section are generally processed with the same hard mask. The L/S section, the SG section, and the peripheral Tr section are provided with a cell transistor, a selection transistor, and another peripheral transistor respectively.

Recently, finer circuit patterns cause a very high aspect ratio in the gate structure of the flash memory. For this reason, when a gate processing is performed with a hard mask, there is a high possibility of causing a pattern collapse of the gate structure together with the hard mask. Therefore, a thinner hard mask has been required recently. The pattern collapse of the gate structure particularly tends to occur in the L/S section, because the L/S section significantly becomes finer, so that the aspect ratio of the gate structure in the L/S section is particularly high. Accordingly, it is desirable that the hard mask is as thin as possible, in view of preventing the pattern collapse of the gate structure.

On the other hand, it is necessary to form diffusion layers under source and drain regions in the peripheral Tr section, after the gate processing. The diffusion layers are formed to prevent depletion layers from extending to areas under the source and drain regions. This raises a punch through breakthrough voltage between transistors neighboring via an STI. The diffusion layers are formed by deeply implanting impurities with a high acceleration voltage. At this time, the hard mask prevents the impurities from being implanted in a channel region of the peripheral Tr section. However, if the hard mask is thin, the impurities penetrate the hard mask to be implanted in the channel region. This may give a bad influence on a channel profile. Accordingly, it is desirable that the hard mask is as thick as possible, in view of protecting the channel region.

SUMMARY OF THE INVENTION

An aspect of the present invention is, for example, a method of manufacturing a semiconductor device having an L/S (line and space) section, the method including depositing a first mask layer above a substrate, depositing a second mask layer on the first mask layer, depositing a third mask layer on the second mask layer, forming a resist on the third mask layer, processing the third mask layer using the resist as a mask, processing the second mask layer using the third mask layer as a mask, slimming the second mask layer in the L/S section and out of the L/S section, peeling the third mask layer in the L/S section and out of the L/S section, forming spacers on sidewalls of the second mask layer in the L/S section and out of the L/S section, covering, with a resist, the second mask layer out of the L/S section, etching the second mask layer in the L/S section, under a condition that the second mask layer out of the L/S section is covered with the resist, to remove the second mask layer in the L/S section while the second mask layer out of the L/S section remains, and processing the first mask layer by etching, using the spacers in the L/S section and out of the L/S section and the second mask layer out of the L/S section as a mask, the spacers in the L/S section and out of the L/S section and the second mask layer out of the L/S section being thinned by the etching.

Another aspect of the present invention is, for example, a semiconductor device having an L/S (line and space) section, the device including a substrate, a first gate insulator formed on the substrate, in the L/S section and out of the L/S section, first gate electrodes formed on the first gate insulator, in the L/S section and out of the L/S section, second gate insulators formed on the first gate electrodes, in the L/S section and out of the L/S section, second gate electrodes formed on the second gate insulators, in the L/S section and out of the L/S section, and mask layers formed on the second gate electrodes, in the L/S section and out of the L/S section, the mask layer out of the L/S section having a first portion with a first thickness and second portions with a second thickness thinner than the first thickness, and the thickness of the mask layer in the L/S section is thinner than the first thickness of the first portion out of the L/S section.

DESCRIPTION OF THE EMBODIMENTS

Embodiments of the present invention will be described below with reference to the accompanying drawings.

Figure 1A:
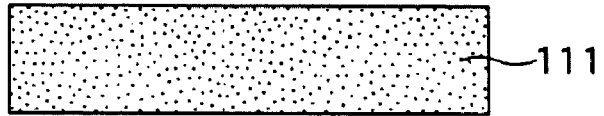
FIGS. 1A to 1N illustrate a manufacturing process of a semiconductor device according to an embodiment of the present invention.
Figure 1B:
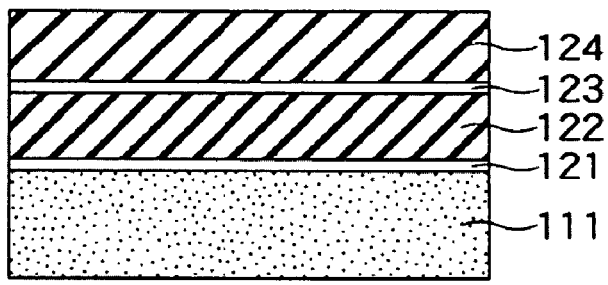
Figure 1C:
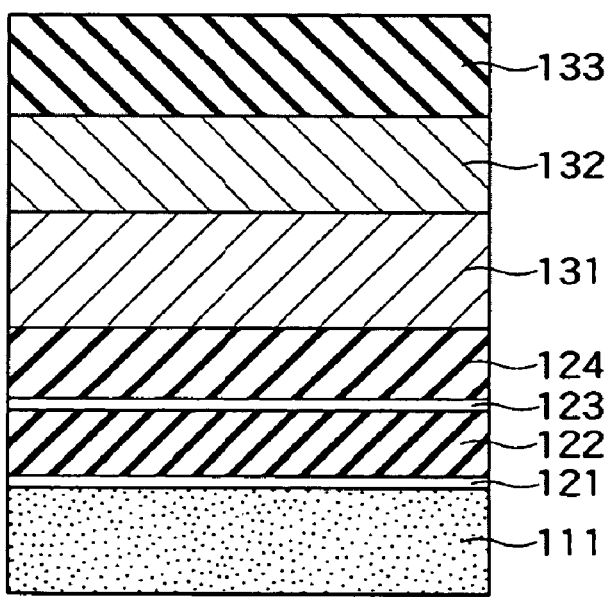
Figure 1D:
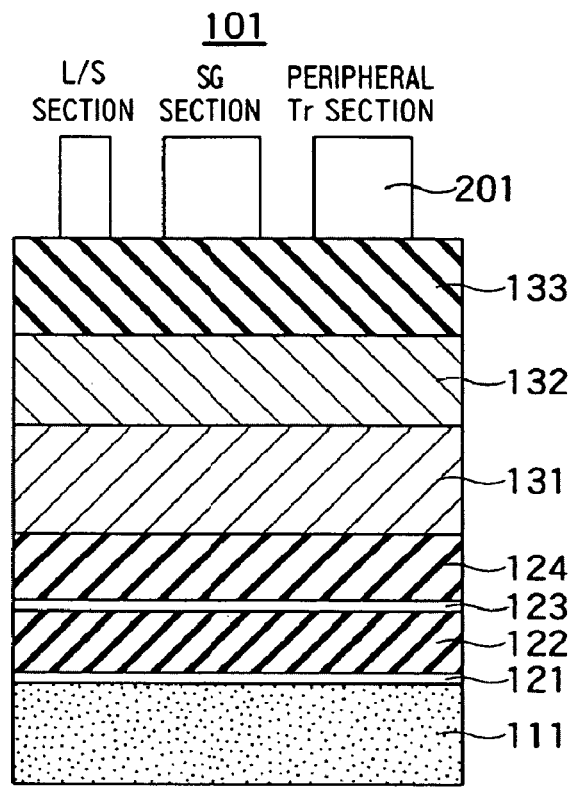
Figure 1E:
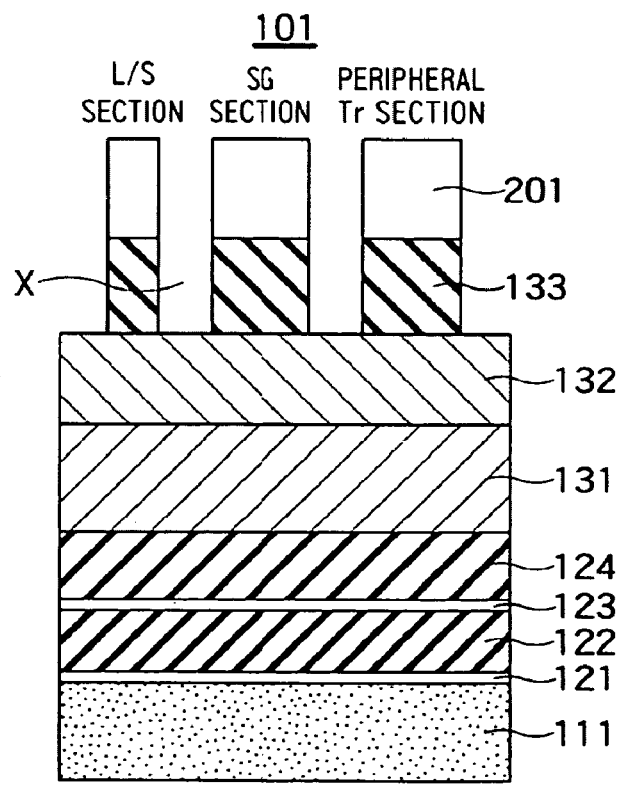
Figure 1F:
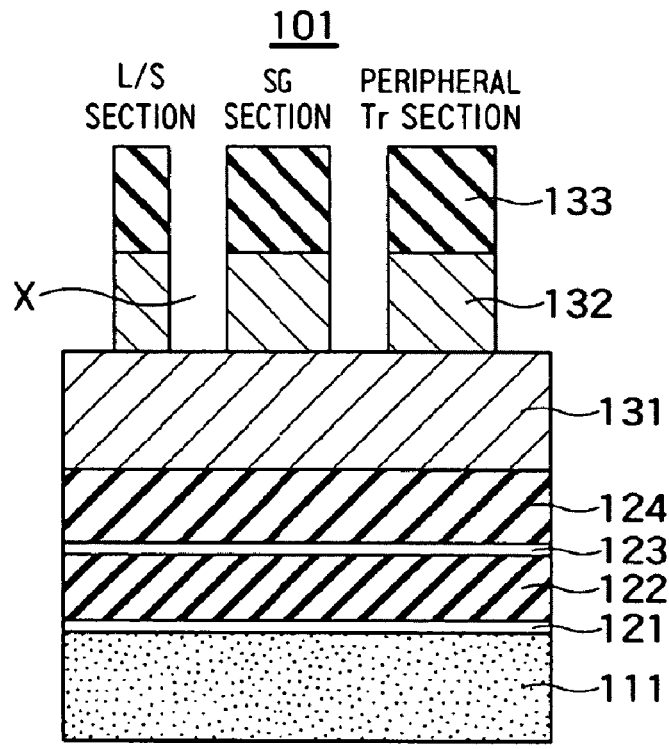
Figure 1G:
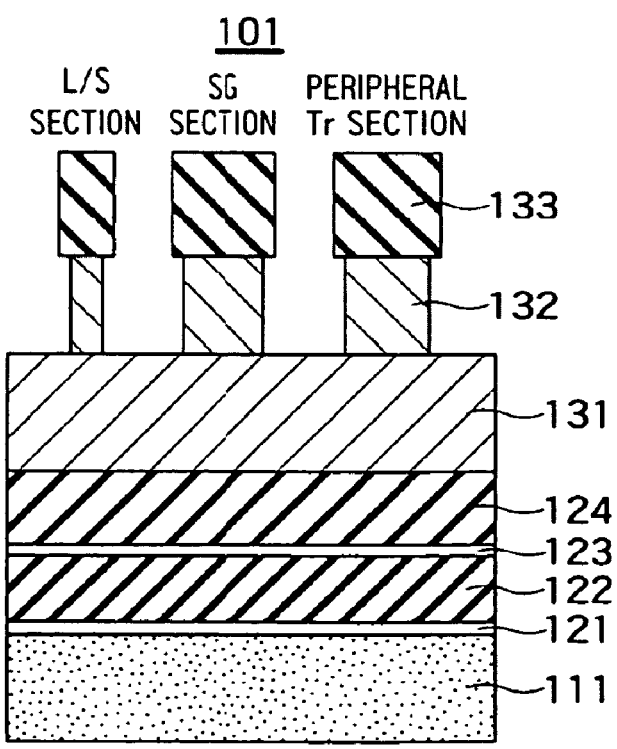
Figure 1H:
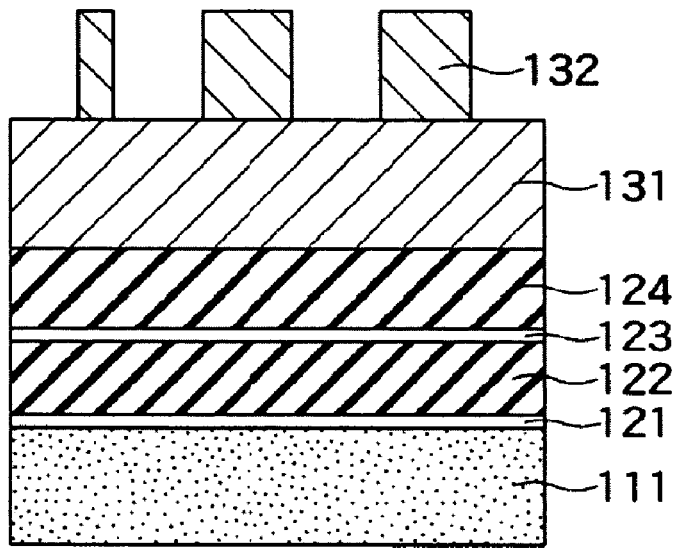
Figure 1I:
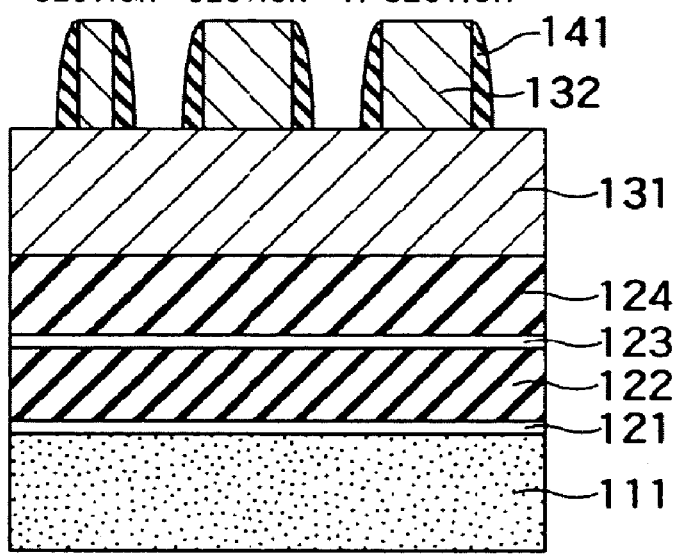
Figure 1J:
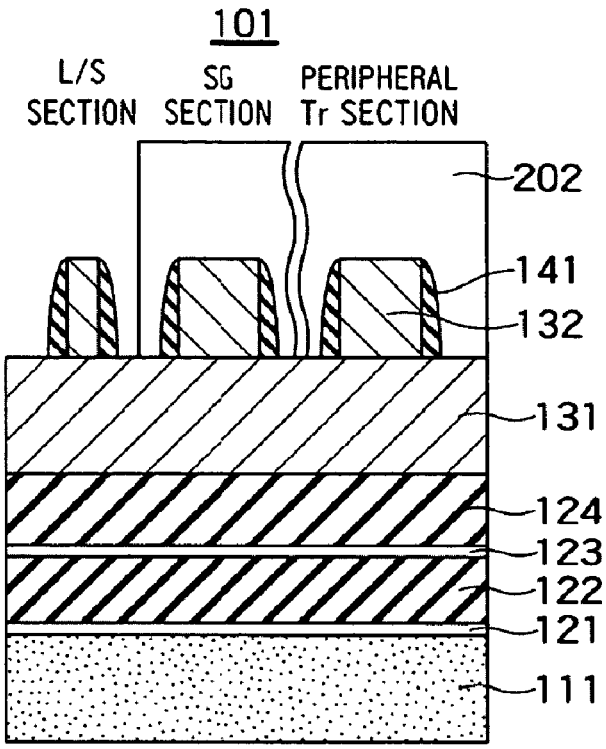
Figure 1K:
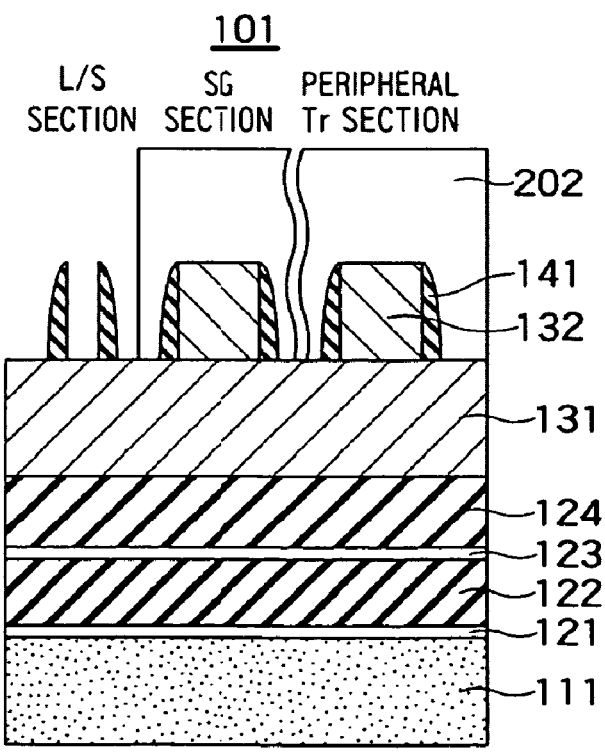
Figure 1L:
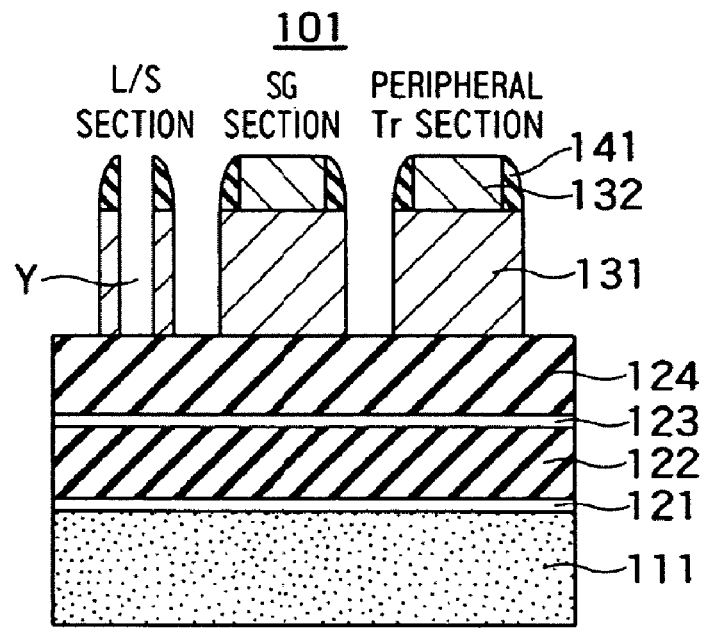
Figure 1M:
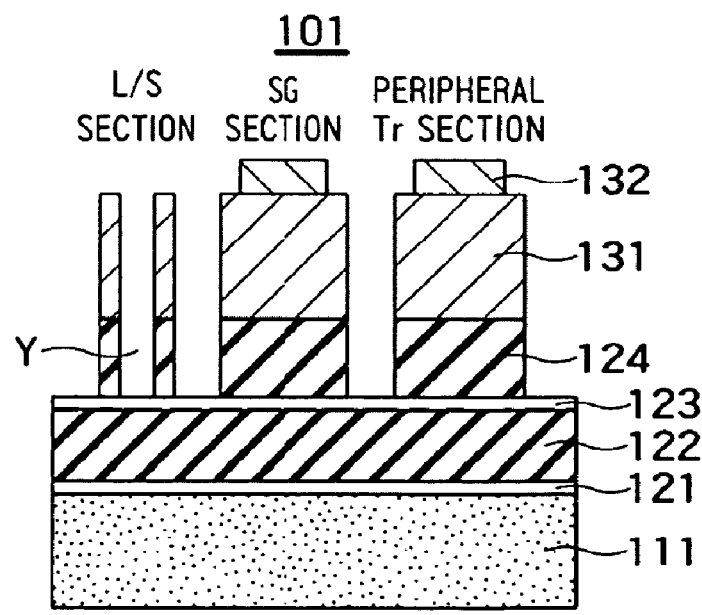
Figure 1N:
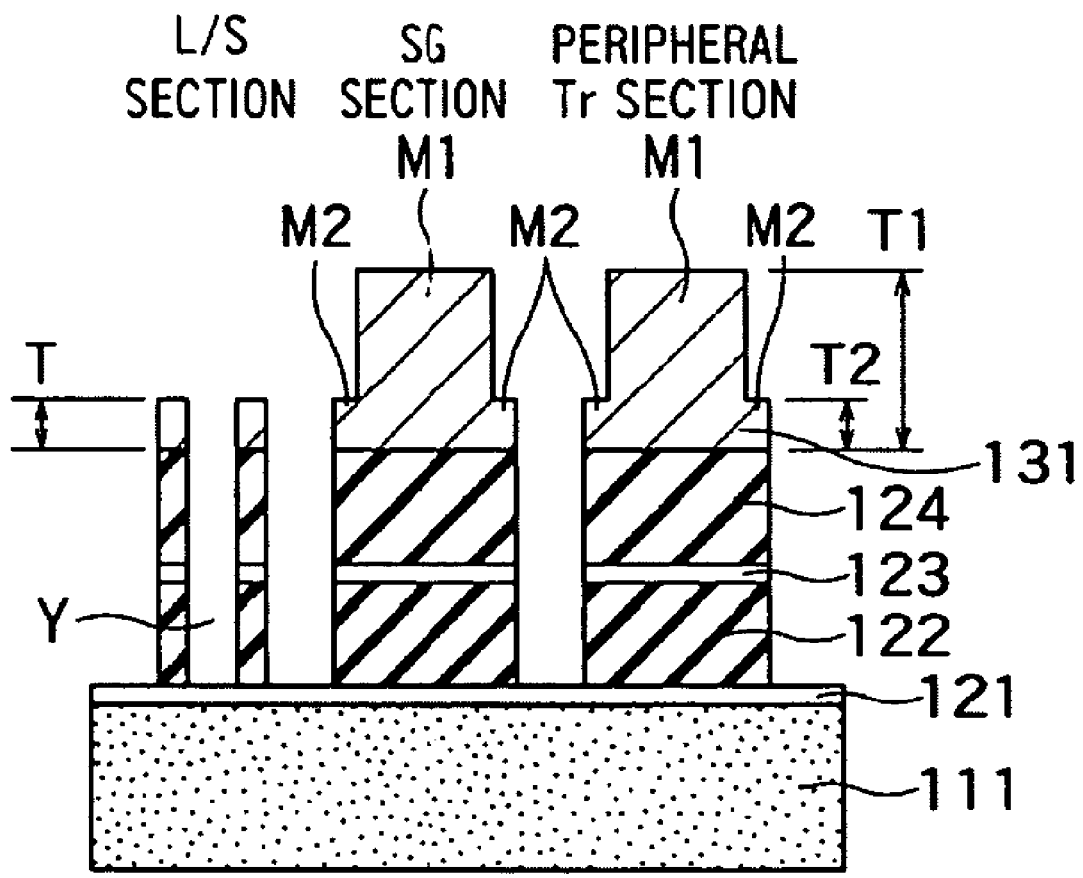

FIGS. 1A to 1N illustrate a manufacturing process of a semiconductor device 101 according to an embodiment of the present invention. The semiconductor device 101 in this embodiment is a flash memory, more particularly, a NAND-type flash memory. According the manufacturing process shown in FIGS. 1A to 1N, a semiconductor device 101 having an L/S (line and space) section, an SG (selection gate) section, and a peripheral Tr (transistor) section is manufactured. The L/S section, the SG section, and the peripheral Tr section are provided with a cell transistor, a selection transistor, and another peripheral transistor respectively.

First, a substrate 111 is prepared (FIG. 1A). The substrate 111 in this embodiment is a silicon substrate. The substrate 111 may be a semiconductor substrate or a SOI (Semiconductor On Insulator) substrate. Then, a channel region is formed in the substrate 111 by a known method. The channel region in this embodiment is a P-type region. Then, an isolation layer is formed in the substrate 111 by a known method. The isolation layer in this embodiment is STI (Shallow Trench Isolation). The thickness of the isolation layer in this embodiment is 300 to 350 nm.

Next, a first gate insulator (tunnel insulator) 121 is deposited on the substrate 111 (FIG. 1B). The first gate insulator 121 in this embodiment is a single layer including a silicon oxide layer, or a stack layer including a silicon oxide layer and a silicone nitride layer. Then, a first gate electrode layer (floating gate layer) 122 is deposited on the first gate insulator 121 (FIG. 1B). The first gate electrode layer 122 in this embodiment is a polysilicon layer, which is called FG-Poly. Then, a second gate insulator (inter layer dielectric) 123 is deposited on the first gate electrode layer 122 (FIG. 1B). The second gate insulator 123 in this embodiment is a silicon oxide layer, which is called IPD (Inter-Poly Dielectric). Then, a second gate electrode layer (control gate layer) 124 is deposited on the second gate insulator 123 (FIG. 1B). The second gate electrode layer 124 in this embodiment is a polysilicon layer, which is called CG-Poly. In this manner, the first gate insulator 121, the first gate electrode layer 122, the second gate insulator 123, and the second gate electrode layer 124 are deposited on the substrate 111 (FIG. 1B). The thickness of the first gate electrode layer 122 in this embodiment is 60 nm. The thickness of the second gate electrode layer 124 in this embodiment is 100 nm.

Next, a first mask layer 131 is deposited on the second gate electrode layer 124 (FIG. 1C). The first mask layer 131 in this embodiment is a silicon nitride layer. Then, a second mask layer 132 is deposited on the first mask layer 131 (FIG. 1C). The second mask layer 132 in this embodiment is a silicon oxide layer. Then, a third mask layer 133 is deposited on the second mask layer 132 (FIG. 1C). The third mask layer 133 in this embodiment is an amorphous silicon layer. In this manner, the first to third mask layers 131 to 133 are deposited above the substrate 111 (FIG. 1C). The thickness of the first mask layer 131 in this embodiment is 50 nm.

Next, a resist 201 is applied on the third mask layer 133 (FIG. 1D). Then, the resist 201 is patterned by lithography (FIG. 1D). In this manner, the resist (resist pattern) 201 for processing the L/S, the SG, and the peripheral Tr sections are formed (FIG. 1D).

Next, the third mask layer 133 is processed by dry etching using the resist 201 as a mask. Thereby, trenches X penetrating the third mask layer 133 are formed (FIG. 1E). Then, the second mask layer 132 is processed by dry etching using the third mask layer 133 as a mask. Thereby trenches X penetrating the third mask layer 133 and the second mask layer 132 are formed (FIG. 1F). The width of a mask part and the width of a trench part in the L/S section are both 64 nm in this embodiment. In this manner, when the trenches X penetrating the third mask layer 133 and the second mask layer 132 are formed, the trenches X are formed so that the width of the mask part of the second mask layer 132 becomes substantially identical with the width of the trench part of the second mask layer 132 in the L/S section (FIGS. 1E and 1F).

Next, the second mask layer 132 in the L/S, the SG, and the peripheral Tr sections is slimmed by wet etching using the third mask layer 133 as a mask. Thereby, the second mask layer 132 in the L/S section and out of the L/S section is slimmed (FIG. 1G). The width of the mask part and the width of the trench part in the L/S section are respectively 32 nm and 128 nm in this embodiment. In this manner, the second mask layer 132 is slimmed so that, in the L/S section, the width of the mask part of the second mask layer 132 becomes narrower than the width of the trench part of the second mask layer 132. Then, the third mask layer 133 in the L/S, the SG, and the peripheral Tr sections is peeled off by wet etching. Thereby, the third mask layer 133 in the L/S section and out of the L/S section is peeled off (FIG. 1H). Then, spacers 141 are formed by CVD and dry etching on sidewalls of the second mask layer 132 in the L/S, the SG, and the peripheral Tr sections. Thereby, the spacers 141 are formed on the sidewalls of the second mask layer 132 in the L/S section and out of the L/S section (FIG. 1I). The spacers 141 in this embodiment are amorphous silicon layers. The width of each of the spacers 141 in this embodiment is 32 nm. In this manner, the width of each of the spacers 141 (32 nm in this embodiment) is narrower than the width of the mask part of the second mask layer 132 in the L/S section before slimming (64 nm in this embodiment).

Next, a resist 202 is formed on the second mask layer 132 in the SG and the peripheral Tr sections. Thereby, the second mask layer 132 out of the L/S section is covered with the resist 202 (FIG. 1J). Then, the second mask layer 132 in the L/S section is etched under a condition that the second mask layer 132 in the SG and the peripheral Tr sections is covered with the resist 202, to remove the second mask layer 132 in the L/S section while the second mask layer 132 in the SG and the peripheral Tr sections remains. In this manner, the second mask layer 132 in the L/S section is etched under a condition that the second mask layer 132 out of the L/S section is covered with the resist 202, to remove the second mask layer 132 in the L/S section while the second mask layer 132 out of the L/S section remains (FIG. 1K). The etching in this embodiment is wet etching.

Next, as shown in FIG. 1L, the first mask layer 131 is processed by etching, using the spacers 141 in the L/S section and out of the L/S section and the second mask layer 132 out of the L/S section as a mask. Trenches Y penetrating the first mask layer 131 in the L/S section and out of the L/S section are formed by the etching. Further, the spacers 141 in the L/S section and out of the L/S section and the second mask layer 132 out of the L/S section is thinned by the etching. In the embodiment, the etching makes finer the mask width and the trench width of the first mask layer 131 in the L/S section. In the embodiment, using such mask structure enables to form a fine line and space (L/S).

Next, as shown in FIG. 1M, the second gate electrode layer 124 is processed by etching, using the spacers 141 in the L/S section and out of the L/S section and the second mask layer 132 out of the L/S section as a mask. Trenches Y penetrating the first mask layer 131 and the second gate electrode layer 124 in the L/S section and out of the L/S section are formed by the etching. Further, the spacers 141 in the L/S section and out of the L/S section are removed by the etching. At this time, if a selection ratio of a silicon layer and a silicon oxide layer is obtained sufficiently, the spacers 141 in the L/S section and out of the L/S section can be removed while the second mask layer 132 out of the L/S section remains.

Next, as shown in FIG. 1N, the second gate insulator 123 and the first gate electrode layer 122 are processed by etching, using the first mask layer 131 in the L/S section and the second mask layer 132 out of the L/S section as a mask. Trenches Y penetrating the first mask layer 131, the second gate electrode layer 124, the second gate insulator 123, and the first gate electrode layer 122 in the L/S section and out of the L/S section are formed by the etching. Further, the first mask layer 131 in the L/S section is thinned, and the second mask layer 132 out of the L/S section is removed, by the etching. Moreover, first portions $M_1$ having a first thickness $T_1$ and second portions $M_2$ having a second thickness $T_2$ thinner than the first thickness $T_1$, are formed in the first mask layer 131 out of the L/S section, by the etching. The second mask layer 132 is provided on the first portions $M_1$ in steps shown in FIGS. 1L and 1M. The spacers 141 are provided on the second portions $M_2$ in a step shown in FIG. 1L.

As a result of the etching in the step shown in FIG. 1N, the thickness of the first mask layer 131 in the L/S section becomes thinner than the thickness of the first mask layer 131 out of the L/S section. More specifically, as a result of the etching, the thickness of the first mask layer 131 in the L/S section (T) becomes thinner than the thickness of the first portions $M_1$ out of the L/S section ($T_1$). On the other hand, the thickness of the second portions $M_2$ out of the L/S section ($T_2$) becomes substantially equal to the thickness of the first mask layer 131 in the L/S section (T), in the step shown in FIG. 1N.

As described above, in this embodiment, the thickness of the first mask layer 131 in the L/S section can be thinner than the thickness of the first mask layer 131 in the SG and the peripheral Tr sections. Accordingly, in this embodiment, it is possible to thin the mask layer in the L/S section, to prevent a pattern collapse of a gate structure in the L/S section. Further, in this embodiment, it is possible to thicken the mask layer in the peripheral Tr section, to protect a channel region in the peripheral Tr section. That is, the channel region in the peripheral Tr section can be protected from impurity implanting, when diffusion layers are formed under source and drain regions in the peripheral Tr section. In this manner, this embodiment enables both preventing the pattern collapse of the gate structure and protecting the channel region.

In the SG and the peripheral Tr sections, the thickness of the second portions $M_2$ is thinner than the thickness of the first portions $M_1$. However, the area of a second portion $M_2$ is very small compared with the area of a first portion $M_1$, and second portions $M_2$ are formed only at small portions of both ends of the mask layer in the SG and the peripheral Tr sections. Accordingly, the protection of the channel region in the peripheral Tr section can be sufficiently achieved, even though the second portions $M_2$ are formed in the mask layer in the peripheral Tr section.

In this embodiment, after the gate processing of the semiconductor device 101, sidewall insulators are formed on sidewalls of each gate structure. The sidewall insulators in this embodiment are TEOS layers. Further, in this embodiment, source and drain regions are formed in the substrate 111. The source and drain regions in this embodiment are N-type regions. Moreover, in this embodiment, diffusion layers are formed under the source and drain regions in the peripheral Tr section. At this time, the channel region is protected by the first mask layer 131. The diffusion layers in this embodiment are P-type region.

Figure 2:
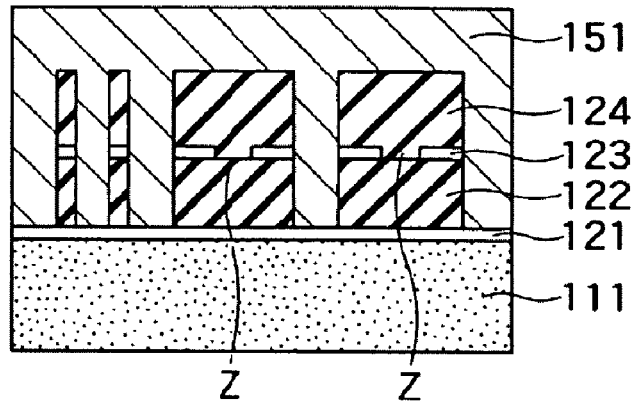
FIG. 2 is a side sectional view showing a semiconductor device according to an embodiment of the present invention.
Figure 3:
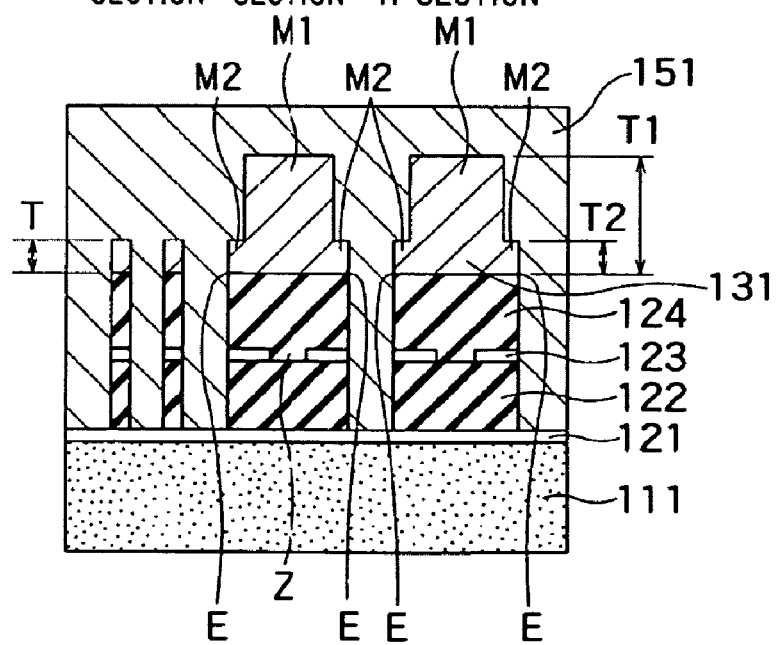
FIG. 3 is a side sectional view showing a semiconductor device according to an embodiment of the present invention.

After that, an inter layer dielectric is deposited on the entire surface of the substrate 111. At this time, the inter layer dielectric may be deposited after removing the first mask layer 131, or may be deposited without removing the first mask layer 131. FIG. 2 shows an example of a semiconductor device 101 manufactured in the former manner, while FIG. 3 shows an example of a semiconductor device 101 manufactured in the latter manner. FIGS. 2 and 3 show side sectional views of the semiconductor devices 101.

Each of the semiconductor devices 101 includes a substrate 111, a first gate insulator 121 formed on the substrate 111, first gate electrodes 122 formed on the first gate insulator 121, second gate insulators 123 formed on the first gate electrodes 122, second gate electrodes 124 formed on the second gate insulators 123, and an inter layer dielectric 151 described above. The semiconductor device 101 in FIG. 3 further includes mask layers 131 formed on the second gate electrodes 124. The thickness of the mask layers 131 in the L/S section is thinner than the thickness of the mask layers 131 out of the L/S section. In FIG. 3, the inter layer dielectric 151 is formed on the mask layers 131 in the L/S section and out of the L/S section. The inter layer dielectric 151 is, for example, a silicon oxide layer.

In the L/S section, each of the semiconductor devices 101 includes the first gate insulator 121, the first gate electrode (floating gate) 122, the second gate insulator 123, and the second gate electrode (control gate) 124. The semiconductor device 101 in FIG. 3 further includes the mask layer 131, in the L/S section.

In the SG section, each of the semiconductor devices 101 includes the first gate insulator 121, the first gate electrode 122, the second gate insulator 123, and the second gate electrode 124. The semiconductor device 101 in FIG. 3 further includes the mask layer 131, in the SG section. In the SG section of each of the semiconductor devices 101, the first gate electrode 122 and the second gate electrode 124 are electrically connected. In the semiconductor device 101 in FIG. 3, the thickness of the mask layer 131 in the L/S section is thinner than the thickness of the mask layer 131 in the SG section.

In the peripheral Tr section, each of the semiconductor devices 101 includes the first gate insulator 121, the first gate electrode 122, the second gate insulator 123, and the second gate electrode 124. The semiconductor device 101 in FIG. 3 further includes the mask layer 131 in the peripheral Tr section. In the peripheral Tr section of each of the semiconductor devices 101, the first gate electrode 122 and the second gate electrode 124 are electrically connected. In the semiconductor device 101 in FIG. 3, the thickness of the mask layer 131 in the L/S section is thinner than the thickness of the mask layer 131 in the peripheral Tr section.

As described above, in the semiconductor device 101 of FIG. 3, the thickness of the mask layers 131 in the L/S section is thinner than the thickness of the mask layers 131 out of the L/S section. More specifically, the thickness of the first mask layers 131 in the L/S section (T) is thinner than the thickness of first portions $M_1$ of the first mask layers 131 out of the L/S section ($T_1$). On the other hand, the thickness of second portions $M_2$ of the first mask layers 131 out of the L/S section ($T_2$) is substantially equal to the thickness of the first mask layers 131 in the L/S section (T). Details of the first portions $M_1$ and the second portions $M_2$ are given in the above description regarding FIG. 1N. The first portion $M_1$ is formed on the second gate electrode 122 so as to be sandwiched between the second portions $M_2$. The second portions $M_2$ are formed on edges E of the second gate electrode 122 so as to sandwich the first portion $M_1$. FIG. 3 shows are one first portion $M_1$ in the SG section, two opposite second portions $M_2$ in the SG section, and two opposite edges E in the SG section. Further, FIG. 3 shows one first portions $M_1$ in the peripheral Tr section, two opposite second portions $M_2$ in the peripheral Tr section, and two opposite edges E in the peripheral Tr section.

In FIG. 3, trenches Z are formed in the second gate insulators 123 in the SG and the peripheral Tr sections. In the step shown in FIG. 1B, the second gate insulator 123 is deposited on the first gate electrode layer 122, and then the trenches Z penetrating the second gate insulator 123 are formed in the SG and the peripheral Tr sections. Further, in the step shown in FIG. 1B, the second gate electrode layer 124 is deposited on the second gate insulator 123 having the trenches Z. As a result, the first gate electrode layers 122 and the second gate electrode layers 124 are electrically connected in the SG and the peripheral Tr sections (FIG. 3). The description of this paragraph is similarly applied to FIG. 2.

In the step shown in FIG. 1B, the first gate electrode layer 122 and the second gate electrode layer 124 are formed with materials having the same composition, in this embodiment. In this embodiment, each of the first gate electrode layer 122 and the second gate electrode layer 124 is a polysilicon layer. However, the first gate electrode layer 122 and the second gate electrode layer 124 may be formed with materials having different compositions.

More specifically, the second gate electrode layer 124 shown in FIG. 1B includes first and second polysilicon layers. The first polysilicon layer is deposited on the second gate insulator 123 before forming the trenches Z (FIG. 3) in the second gate insulator 123. The trenches Z are formed so as to penetrate the first polysilicon layer and the second gate insulator 123. The second polysilicon layer is deposited on the first polysilicon layer after forming the trenches Z penetrating the first polysilicon layer and the second gate insulator 123. As a result, the first gate electrode layers 122 and the second gate electrode layers 124 are electrically connected in the SG and the peripheral Tr sections (FIG. 3). The description of this paragraph is similarly applied to FIG. 2.

The second gate electrodes 124 in FIGS. 2 and 3 may be suicide layers. Examples of the suicide layers include nickel silicide layers and cobalt silicide layers. The whole part of a second gate electrode 124 may be silicide, or only the upper part of a second gate electrode 124 may be silicide. Further, the second electrodes 124 in FIGS. 2 and 3 may be metal layers.

As described above, embodiments of the present invention can provide, regarding a semiconductor device and a method of manufacturing the same, a preferred mask layer for gate processing of the semiconductor device.

The invention claimed is:

1. A method of manufacturing a semiconductor device having an L/S (line and space) section, the method comprising:
   depositing a first mask layer above a substrate;
   depositing a second mask layer on the first mask layer;
   depositing a third mask layer on the second mask layer;
   forming a resist on the third mask layer;
   processing the third mask layer using the resist as a mask;
   processing the second mask layer using the third mask layer as a mask;
   slimming the second mask layer in the L/S section and out of the L/S section;
   peeling the third mask layer in the L/S section and out of the L/S section;
   forming spacers on sidewalls of the second mask layer in the L/S section and out of the L/S section;
   covering, with a resist, the second mask layer out of the L/S section;
   etching the second mask layer in the L/S section, under a condition that the second mask layer out of the L/S section is covered with the resist, to remove the second mask layer in the L/S section while the second mask layer out of the L/S section remains; and
   processing the first mask layer by etching, using the spacers in the L/S section and out of the L/S section and the second mask layer out of the L/S section as a mask, the spacers in the L/S section and out of the L/S section and the second mask layer out of the L/S section being thinned by the etching.

2. The method according to claim 1, further comprising:
   depositing a first gate insulator on the substrate;
   depositing a first gate electrode layer on the first gate insulator;
   depositing a second gate insulator on the first gate electrode layer; and
   depositing a second gate electrode layer on the second gate insulator,
   wherein the first mask layer is deposited on the second gate electrode layer.

3. The method according to claim 2, further comprising:
   processing the second gate electrode layer by etching, using the spacers in the L/S section and out of the L/S section and the second mask layer out of the L/S section as a mask, the spacers in the L/S section and out of the L/S section being removed by the etching; and
   processing the second gate insulator and the first gate electrode layer by etching, using the first mask layer in the L/S section and the second mask layer out of the L/S section as a mask, the first mask layer in the L/S section being thinned by the etching, the second mask layer out of the L/S section being removed by the etching, and a first portion having a first thickness and second portions having a second thickness thinner than the first thickness being formed in the first mask layer out of the L/S section by the etching,
   wherein, as a result of the etching for processing the second gate insulator and the first gate electrode layer, the thickness of the first mask layer in the L/S section becomes thinner than the first thickness of the first portion out of the L/S section.

4. The method according to claim 3, wherein,
   the first mask layer is provided on the first portion, when the second mask layer and the spacers are provided on the first mask layer, and
   the spacers are provided on the second portions, when the second mask layer and the spacers are provided on the first mask layer.

5. The method according to claim 3, further comprising:
   forming an inter layer dielectric on the first mask layer in the L/S section and out of the L/S section.

6. The method according to claim 1, wherein the third mask layer and the second mask layer are processed to form a trench penetrating the third mask layer and the second mask layer.

7. The method according to claim 6, wherein,
   when the trench penetrating the third mask layer and the second mask layer is formed, the trench in the L/S section is formed so that the width of a mask part in the second mask layer is identical with the width of a trench part in the second mask layer.

8. The method according to claim 6, wherein the second mask layer is slimmed so that, in the L/S section, the width of a mask part in the second mask layer becomes narrower than the width of a trench part in the second mask layer.

9. The method according to claim 6, wherein the width of the spacers is narrower than the width of a mask part of the second mask layer in the L/S section before slimming.

10. The method according to claim 1, wherein the spacers are amorphous silicon layers.

11. The method according to claim 1, wherein the first mask layer is a silicon nitride layer, the second mask layer is a silicon oxide layer, and the third mask layer is an amorphous silicon layer.

12. The method according to claim 2, wherein,
   the first gate electrode layer and the second gate electrode layer are electrically connected out of the L/S section.

13. The method according to claim 12, wherein,
the first gate electrode layer and the second gate electrode layer are electrically connected out of the L/S section by:
depositing the second gate insulator on the first gate electrode layer and then forming a trench penetrating the second gate insulator out of the L/S section, and
depositing the second gate electrode layer on the second gate insulator having the trench.

14. The method according to claim 2, wherein the first gate electrode layer and the second gate electrode layer are formed of materials having the same/S-component.

15. The method according to claim 2, wherein,
the first gate electrode layer is a polysilicon layer, and
the second gate electrode layer is a polysilicon layer, a silicide layer, or a metal layer.

* * * * *